(12) United States Patent
Pascucci

(10) Patent No.: US 6,362,658 B1
(45) Date of Patent: Mar. 26, 2002

(54) DECODER FOR MEMORIES HAVING OPTIMIZED CONFIGURATION

(75) Inventor: Luigi Pascucci, Sesto San Giovanni (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 09/716,747

(22) Filed: Nov. 20, 2000

(30) Foreign Application Priority Data

Nov. 25, 1999 (IT) .......................................... MI99A2465

(51) Int. Cl.[7] .......................................... H03K 19/084
(52) U.S. Cl. ........................ 326/105; 326/106; 326/108; 365/230.06
(58) Field of Search ................................ 326/105, 106, 326/108; 365/230.06

(56) References Cited

U.S. PATENT DOCUMENTS 5,773,995 A * 6/1998 Crocker ....................... 326/108
6,064,234 A * 5/2000 Masuda et al. ............. 326/119
6,087,855 A * 7/2000 Frederick, Jr. et al. ..... 326/106
6,144,227 A * 11/2000 Sato ........................... 326/119
6,222,788 B1 * 4/2001 Forbes et al. .......... 365/230.06

* cited by examiner

Primary Examiner—Michael Tokar
Assistant Examiner—Vibol Tan
(74) Attorney, Agent, or Firm—Lisa K. Jorgenson; Allen, Dyer, Doppelt, Milbrath & Gilchrist, P.A.

(57) ABSTRACT

A decoder with reduced complexity includes at least one OR circuit section and at least one AND circuit section. The at least one OR circuit section may include first and second circuit lines mutually connected and respectively receiving as inputs an address signal and an inverted address signal. The at least one AND circuit section may include first and second circuit lines which respectively receive as inputs the inverted address signal and the address signal. The at least one OR circuit section and the at least one AND circuit section may be connected to first and second booster circuits. Furthermore, the at least one OR circuit section may also include a virtual ground.

48 Claims, 4 Drawing Sheets

US 6,362,658 B1

DECODER FOR MEMORIES HAVING OPTIMIZED CONFIGURATION

FIELD OF THE INVENTION

The present invention relates to the field of electronic circuits, and, more particularly, to memory devices. More specifically, the invention relates to a decoder for memories having an optimized configuration. That is, the invention relates to a decoder, particularly for column decoding in memories, which has substantially no voltage-dependent functionality limitation, which may be produced with minimal area consumption, and is suitable for use in small spaces.

BACKGROUND OF THE INVENTION

One layout for driving the selection lines of a multiplexer in a conventional prior art non-volatile memory is shown in FIG. 1. This circuit layout is simple, compact, and widely used in the field of non-volatile memories. These memories are generally developed for applications using operating voltages in the range of 4.5 to 5.5 volts. Thus, the compatibility of the performance and of the functionality of the layout shown in FIG. 1 is generally sufficient for such operating voltages.

Even so, non-volatile memories which operate at low voltages (i.e., 2.7–3.3 volts and even 1.6–2.0 volts) are increasingly required. In this context, the layout shown in FIG. 1, being close to the operating limit, is affected by slowing ("meta-stability") in its operation. This slowing negatively affects the performance of the entire memory.

Multiplexers in general are designed to select the lines of the memory to be pre-charged. Any slowing thereof leads to an increase in the time required to reach the operating levels and therefore ultimately leads to a longer read time. This is true even in the presence of suitable boost circuits.

Yet, the need to improve the performance of decoders clearly cannot disregard the stringent need to provide a circuit network with a minimal number of devices. That is, the space available for placement of the decoding structure is typically limited in conventional architectures of non-volatile memories.

Two further prior art implementations with a wider operating voltage range are schematically shown in FIGS. 2 and 3. A prior art circuit with fourteen transistors (four more than an embodiment using the conventional approach), in addition to the buffer, is shown in FIG. 2. A more compact prior art circuit which uses only ten transistors (again in addition to the buffer), matching the number of devices of the conventional structure, is shown in FIG. 3.

The examples of FIGS. 1, 2 and 3 include decoders with four inputs and sixteen lines. The circuit structure shown in FIG. 3, however, is not compact enough to meet the area saving requirements that occur in the manufacture of non-volatile memories.

SUMMARY OF THE INVENTION

An object of the present invention is to provide a decoder for memories having an optimized configuration, where the number of devices (transistors) used is further reduced with respect to prior art circuits to allow placement in the most advantageous position of the memory.

Another object of the present invention is to provide a decoder for memories having an optimized configuration whose operation is substantially compatible with circuit portions supplied with different supply voltages and is substantially independent from the supply voltage.

Still another object of the present invention is to provide a decoder for memories having an optimized configuration in which there is a predominance of N-channel devices, which are notoriously faster and more compact than P-channel devices.

Yet another object of the present invention is to provide a decoder for memories having an optimized configuration in which there are no decoupling structures, consequently simplifying decoding management.

A further object of the present invention is to provide a decoder for memories having an optimized configuration with minimization of inversions before producing the final switching of the selected line starting from the main address lines.

An additional object of the present invention is to provide a decoder for memories which has a high performance even at the lowest operating voltages that may be used for the operation of the memories.

One other object of the present invention is to provide a memory decoder which has a highly flexible structure that can perform a selection of a "1" line in a "0" field and vice-versa, substantially without altering the circuit structure.

Furthermore, still another object of the present invention is to provide a memory decoder that is highly reliable and relatively simple to manufacture at competitive costs.

These and other objects, which will become more apparent hereinafter, are provided by a decoder with reduced complexity including at least one OR circuit section and at least one AND circuit section. The at least one OR section may include first and second circuit lines that are mutually connected and respectively receive an address signal and an inverted address signal. Furthermore, the AND section may include first and second circuit lines which respectively receive the inverted address signal and the address signal. The OR circuit section and the AND circuit section may be respectively connected to first and second booster circuits. Also, the at least one OR circuit section may include a virtual ground.

BRIEF DESCRIPTION OF THE DRAWINGS

Further characteristics and advantages of the present invention will become more apparent from the following detailed description of preferred embodiments of the decoder, illustrated by way of non-limitative example, in the accompanying drawings, wherein.

DETAILED DESCRIPTION OF THE PREFERRED EMBODIMENTS

Figure 1:
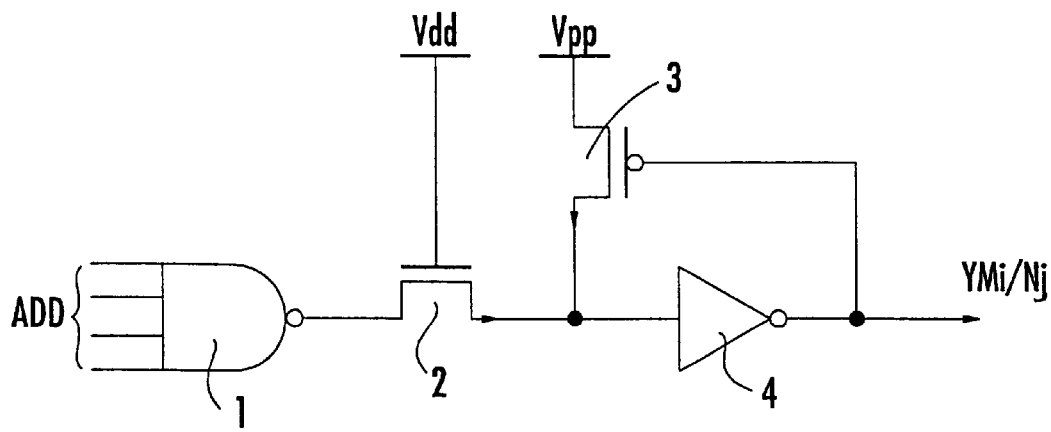
FIGS. 1–3 are schematic diagrams of various prior art decoders.
Figure 2:
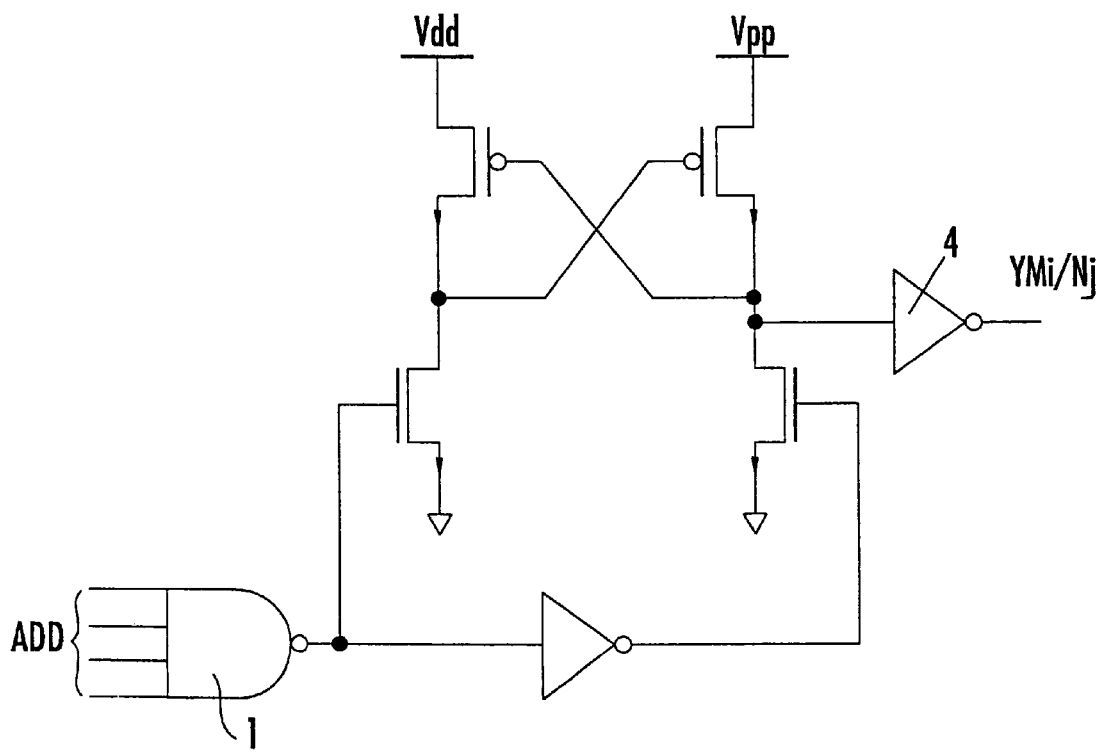
Figure 3:
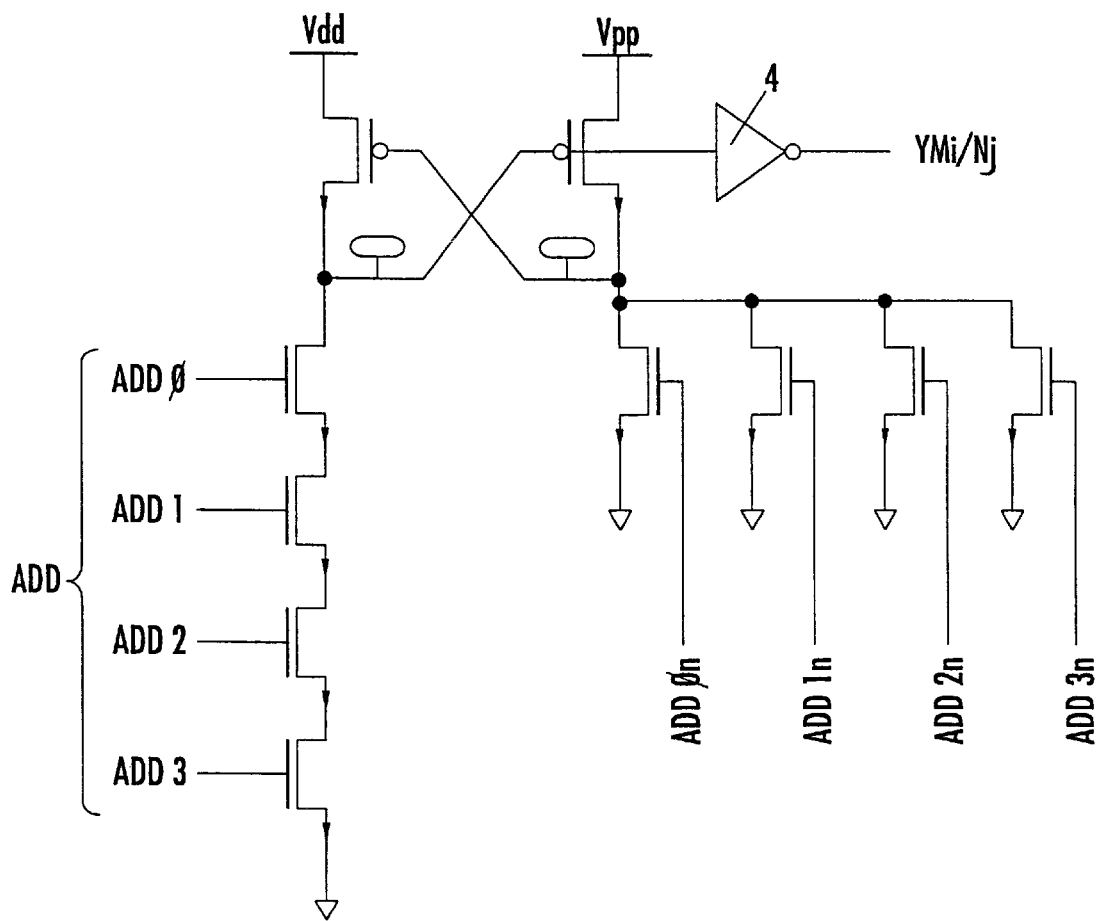

In order to better understand the invention, FIGS. 1–3, which illustrate circuit diagrams of prior art decoders, are now briefly described. The decoder of FIG. 1 includes a NAND gate 1 with four inputs ADD. The NAND gate 1 is connected to a decoupling transistor 2, which is connected to the supply voltage Vdd. In turn, the decoupling transistor 2 is connected to an inverter 4. A P-channel transistor 3 is connected to the voltage Vpp (which is lower than the voltage Vdd) and is also connected in a feedback configuration between an output and an input of the inverter 4.

An output YMi/Nj of the decoder uses YM to designate the selection of groups of bit lines and YN to designate the selection of bit lines within the selected group of bit lines. The circuit shown in FIG. 1 behaves satisfactorily for supply voltages on the order of 5 volts. However, is suffers drawbacks when the supply voltage Vdd drops below this value. This is because it comes increasingly closer to the "metastability" condition which is characterized by responses that are gradually slower and tend to undefined states of the output levels. Moreover, the number of transistors required for the decoder is equal to ten, plus two transistors for the inverter 4.

The circuit shown in FIG. 2, despite being functional for the some of the intended objects noted above, instead uses fourteen transistors. This is four more than the decoder of FIG. 1 and consequently causes considerable difficulties in packing the decoder. Finally, a so-called AND portion of the decoder (i.e., the portion with the addresses ADD) and a so-called OR portion of the decoder with the addresses Add On, . . . Add 3n are illustrated in FIG. 3. This circuit uses ten transistors in addition to the transistors that form the inverter.

A first circuit embodiment of the decoder according to the present invention will now described with reference to FIG. 4. In this embodiment, the number of transistors required for the decoding lines has been significantly reduced. That is, the present embodiment requires only 5.5 transistors per decoding line and at the same time provides the fundamental goal of making the network functionally operational with any supply voltage.

Figure 4:
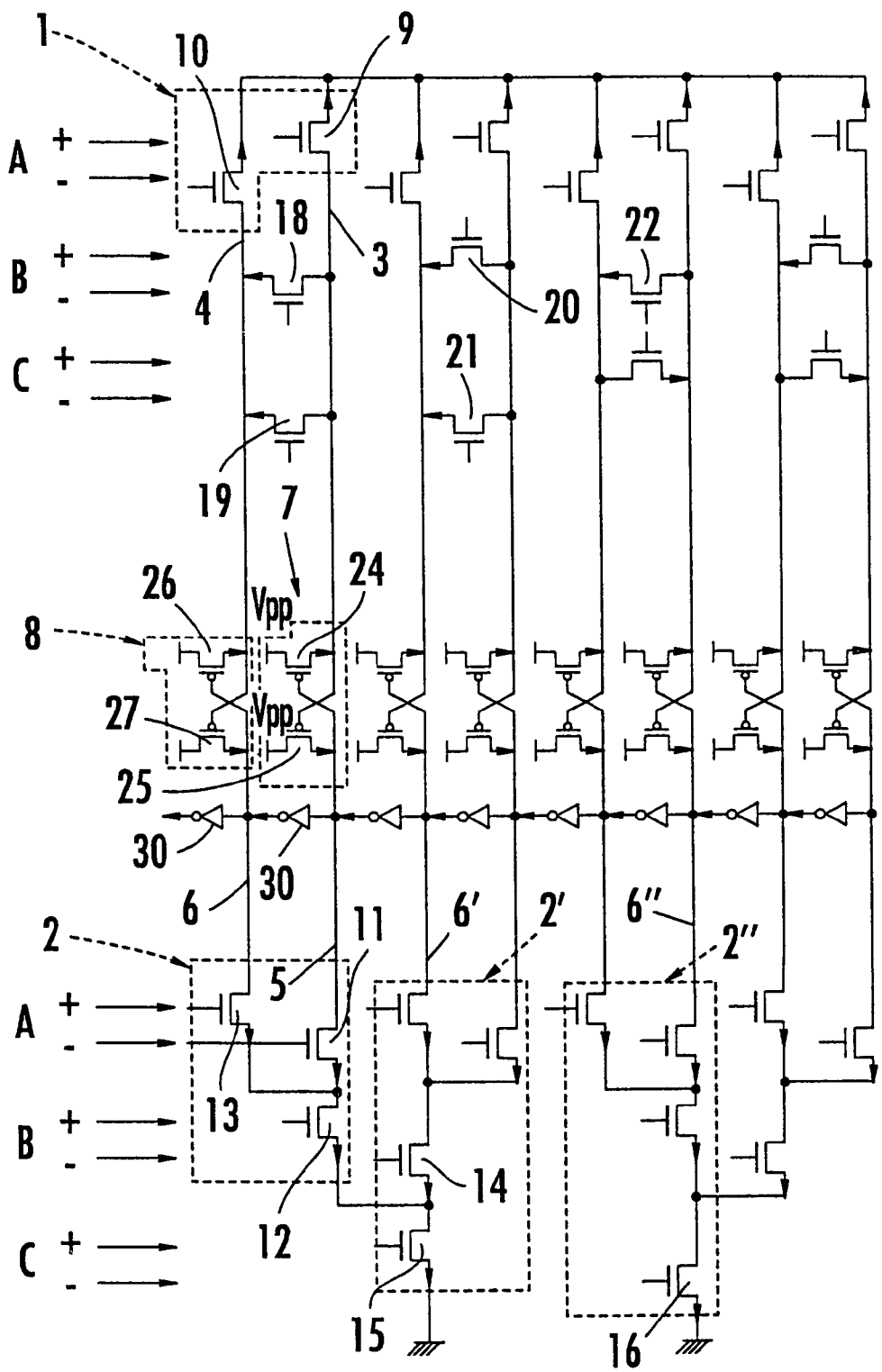
FIG. 4 is a schematic diagram of a first embodiment of the decoder according to the present invention.

FIG. 4 therefore shows a first embodiment of the decoder according to the invention. The example shown in FIG. 4 relates to the case in which the decoder has input signals A+, A−, B+, B− and C+, C−. Of course, the circuit structure shown in FIG. 4 may be extended to a decoder having any number of input signals.

The decoder circuit according to the invention includes an OR circuit section 1 and an AND circuit section 2. The OR circuit section 1 includes a first circuit line 3 and a second circuit line 4 which are mutually connected. The AND circuit section 2 includes a first circuit line 5 and a second circuit line 6 which are also mutually connected.

The OR section 1 and the AND section 2 are connected to first and second booster circuits 7 and 8. In particular, the first circuit line 3 of the OR section 1 is connected to the first booster circuit 7, as is the first circuit line 5 of the AND section 2. The second circuit line 4 of the OR section 1 and the second circuit line 6 of the AND section 2 are connected to the second booster circuit 8.

The decoder according to the invention more preferably includes a plurality of OR circuit sections and of AND circuit sections, whose numbers are equal to the number of input signals fed to the decoder. For the sake of simplicity, reference is made to the structure of a single AND circuit section and of a single OR circuit section. The first circuit line 3 of the OR section 1 includes a first N-channel MOS transistor 9, and the second circuit line 4 of the OR circuit section includes a second transistor 10. The AND circuit section 2 includes, on the first line 5, a third transistor 11, again of the N-channel type, and a fourth N-channel transistor 12. The second circuit line 6 of the AND section includes a fifth N-channel MOS transistor 13.

The address signal A+ is sent to the gate terminal of the transistor 9. The address signal A− is sent to the gate terminal of the transistor 10. The address signal A+ is connected to the gate terminal of the transistor 13, while the address signal A− is connected to the gate terminal of the transistor 11. The transistor 12 receives as an input the signal B+. The complementary signal B− is input to the gate terminal of a sixth transistor 14. The sixth transistor 14 is arranged at a second circuit line 6' of an AND section which is adjacent to the AND section including transistors 11, 12 and 13.

Accordingly, the first circuit line 5 of the AND section is connected to the second circuit line 6' of an adjacent AND section, which has, at the second circuit line 6', a seventh N-channel MOS transistor 15. A source terminal of the seventh N-channel MOS transistor 15 is connected to ground. The source terminal of the transistor 12 is connected to an intermediate point between the source terminal and the drain terminal of the transistors 14 and 15, respectively.

The transistor 15 receives as an input the signal C+. The signal C− is input to the gate terminal of a transistor 16, which is part of a first circuit line 6" which is in turn part of a third AND section shown in FIG. 4. The second AND section is designated by the reference numeral 2", while the third AND section is designated by the reference numeral 2'. Accordingly, the three signals (i.e., A+ and its inverted version, B+ and its inverted version, and C+ and its inverted version) must be input to three AND circuit sections, i.e., the three circuit sections 2, 2' and 2".

A plurality of N-channel MOS transistors mutually connect the first and second circuit lines 3 and 4 of the OR section and are designated by the reference numerals 18 and 19, respectively. Similar transistors, connected between the first and second circuit lines of the OR sections 2' and 2" are respectively designated by the reference numerals 20, 21 for the OR section 2" and 22, 23 for the OR section 2".

The first booster circuit 7 includes a first P-channel transistor in which the source terminal is connected to the supply voltage Vpp, and the drain terminal is connected to the first circuit line 3 of the OR section. The gate terminal of the transistor 24 is connected to the first circuit line 5 of the AND section. A second P-channel transistor 25 forms the first booster stage 7. Its source terminal is connected to the supply voltage Vpp, its drain terminal is connected to the first circuit line 5 of the AND circuit section, and its gate terminal is connected to the first circuit line 3 of the OR section.

The structure shown in FIG. 4 relates to a set of three fundamental selection lines (A, B, C), but the inventive concept can be extended to any number of selection lines. Likewise, the second circuit stage 8 includes a first P-channel transistor 26 and a second P-channel transistor 27 which are connected in a similar manner to the transistors 24 and 25, respectively.

The output of the decoder according to the invention can be taken at the AND section, as shown in FIG. 4. A plurality of inverters 30 are each connected to the first circuit line 5 of each AND stage, except for the inverter 30 related to the first AND stage. This additional inverter 30 is connected to the second circuit branch 6 of the AND stage. This configuration is used where one wishes to have a "one in zero field" selection. If instead one wishes to have a "zero in one field" selection, it is necessary to take the stimulation point, by way of the inverters 30, from the OR side.

Figure 5:
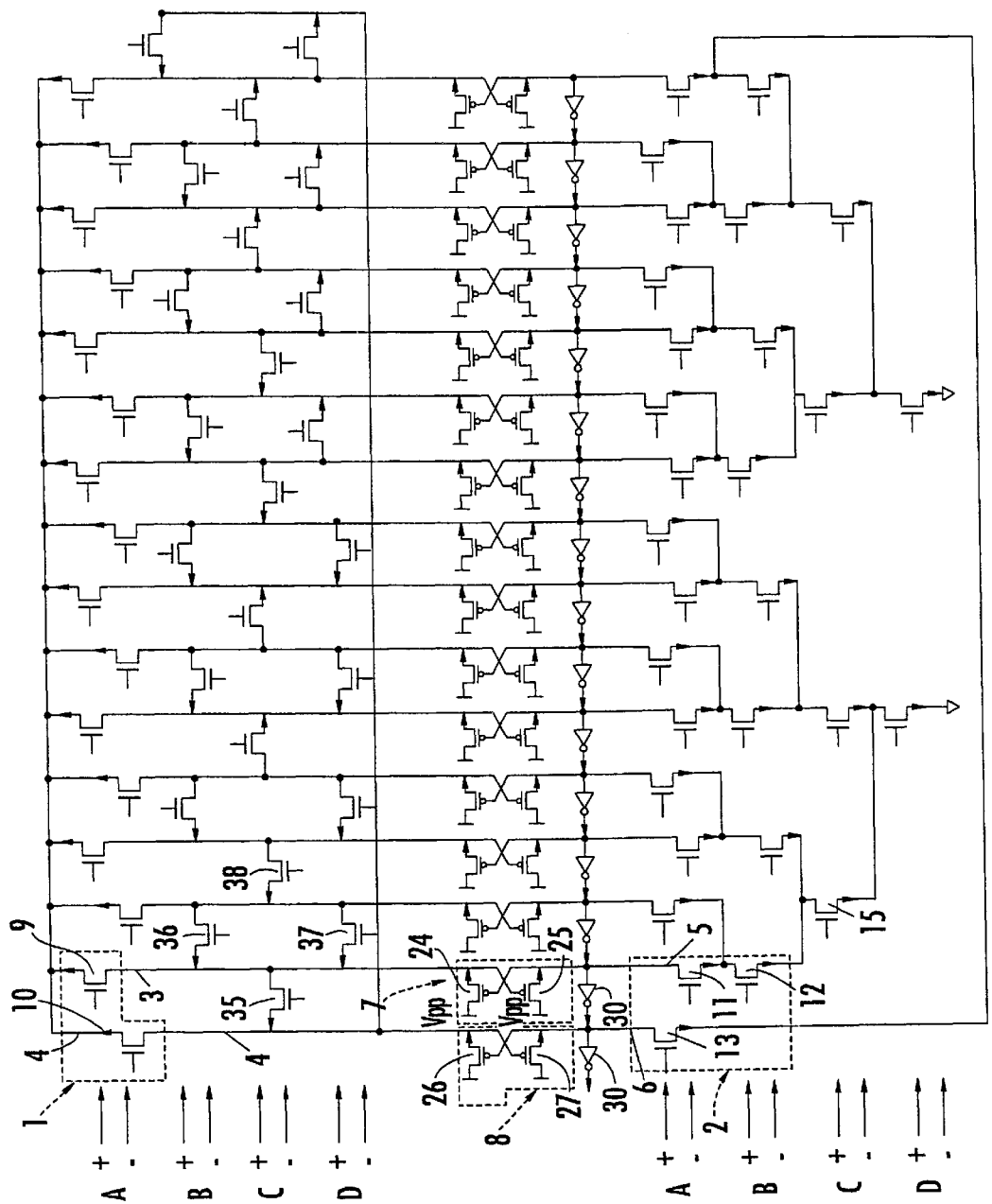
FIG. 5 is a schematic diagram of a second embodiment of the decoder according to the present invention

FIG. 5 is a schematic diagram of a second embodiment of the decoder according to the present invention of the so-called interdigitated type. In this embodiment, the connection transistors 18, 19, 20, 21 and 22, 23 that connect the first and second lines of the OR sections (see FIG. 4) are replaced by transistors 35, 36, 37, 38 which always mutually connect the first and second OR section lines but are mutually interdigitated. This reduces the space that they occupy and thus reduces the physical dimensions of the decoder.

The embodiment shown in FIG. 5 provides a fourth address signal D+ and its inverted version D−, but conceptually this does not alter the circuit structure shown in FIG. 4. In practice, the transistors connected between the first and second lines of the OR section are no longer arranged "face to face" but are interdigitated to advantageously utilize the area savings by eliminating gaps between contiguous lines.

It has been observed that the decoder according to the present invention fully achieves the intended aim and objects noted above. That is, the decoder of the present invention reduces the number of transistors used in prior art decoders with a predominance of N-channel transistors, which are notoriously faster and more compact. Moreover, the decoder of the present invention achieves minimization of inversions before producing the final switching of the line selected starting from the main address lines. Additionally, the performance of the decoder according to the invention is higher even at the lowest voltages, with a wide operating range with respect to the supply voltage Vdd.

The decoder thus conceived is susceptible to numerous modifications and variations, all of which are within the scope of the inventive concept. Of course, other technically equivalent elements to those described above may be used, as will be appreciated by those of skill in the art.

The disclosures in Italian Patent Application No. MI99A002465 from which this application claims priority are incorporated herein by reference.

That which is claimed is:

1. A decoder comprising:
   at least one OR circuit section comprising first and second circuit lines mutually connected and respectively receiving as inputs an address signal and an inverted address signal;
   at least one AND circuit section comprising first and second circuit lines which respectively receive as inputs the inverted address signal and the address signal;
   a first booster circuit connected to said at least one OR circuit section; and
   a second booster circuit connected to said at least one AND circuit section.

2. The decoder according to claim 1 wherein said at least one OR circuit section has a virtual ground.

3. The decoder according to claim 1 wherein said at least one OR circuit section comprises a plurality of OR circuit sections; wherein said at least one AND circuit section comprises a plurality of AND circuit sections corresponding in number to said plurality of OR circuit sections; and wherein each OR circuit section and each AND circuit section is respectively connected to an adjacent OR circuit section and an adjacent AND circuit section, each adjacent AND circuit section being connected to ground.

4. The decoder according to claim 3 wherein said first circut line of each OR circuit section is connected to said second circut line of said respective adjacent OR circuit section and to said first booster circuit; and wherein said second circut line of each OR section is connected to said first circut line of said respective adjacent OR circuit section and to said second booster circuit.

5. The decoder according to claim 3 wherein said first circut line of each AND circuit section is connected to said first circut line of said respective adjacent AND circuit section and to said first booster circuit; and wherein said second circut line of each AND circuit section is connected to said first circut line of said respective adjacent AND section and to said second booster circuit.

6. The decoder according to claim 3 wherein a first one of said plurality of OR circuit sections is connected to a last one of said plurality of OR circuit sections.

7. The decoder according to claim 3 wherein said plurality of OR circuit sections are equal in number to a number of address signals of said decoder; and wherein said first circuit line of each OR circuit section coincides with said second circuit line of an adjacent OR circuit section.

8. The decoder according to claim 7 wherein said plurality of OR sections are mutually connected by a plurality of transistors arranged in an interdigitated configuration.

9. The decoder according to claim 1 wherein said first booster circuit comprises first and second P-channel transistors having control terminals respectively connected to said first circuit line of said at least one OR circuit section and said first circuit line of said at least one AND circuit section.

10. The decoder according to claim 9 wherein said first transistor of said first booster circuit is connected to said first circut line of said at least one AND circuit section at the control terminal thereof, to said first circut line of said at least one OR section at a first conduction terminal thereof, and to a supply voltage at a second conduction terminal thereof.

11. The decoder according to claim 9 wherein said second transistor of said first booster circuit is connected to said first circut line of said at least one OR circuit section at the control terminal thereof, to said first circut line of said at least one AND circuit section at a first conduction terminal thereof, and to a supply voltage at a second conduction terminal thereof.

12. The decoder according to claim 1 wherein said second booster circuit comprises first and second P-channel transistors having control terminals respectively connected to said second circuit line of said at least one OR circuit section and said second circuit line of said at least one AND circuit section.

13. The decoder according to claim 12 wherein said first transistor of said second booster circuit is connected to said second circuit line of said at least one AND circuit section at the control terminal thereof, to said second circuit line of said at least one OR circuit section at a first conduction terminal thereof, and to a supply voltage at a second conduction terminal thereof.

14. The decoder according to claim 12 wherein said second transistor of said second booster circuit is connected to the second line of said at least one OR circuit section at the control terminal thereof, to said first circuit line of said at least one AND circuit section at a first conduction terminal thereof, and to a supply voltage at a second conduction terminal thereof.

15. The decoder according to claim 1 wherein said first circuit line of said at least one OR circuit section comprises a first N-channel transistor which receives as an input the address signal; and wherein said second circuit line of said at least one OR circuit section comprises a second N-channel transistor which receives as an input the inverted address signal.

16. The decoder according to claim 15 wherein said first and second circuit lines of said at least one OR circuit section are mutually connected by a plurality of N-channel transistors; and wherein a number of said plurality of N-channel transistors is equal to a number of address signals input into said decoder except for an address signal which corresponds to the address signal input to said first and second transistors of said at least one OR circuit section.

17. The decoder according to claim 16 wherein said at least one AND circuit section comprises a plurality of AND circuit sections comprising a plurality of transistors equal in number to the number of address signals input to said decoder.

18. The decoder according to claim 16 wherein said first circuit line of said at least one AND circuit section comprises a third N-channel transistor which receives as an input the inverted address signal and a fourth N-channel transistor which receives as an input one of the address signals input into the decoder; and wherein said second circuit line of said at least one AND circuit section comprises a fifth N-channel transistor which receives as an input the address signal.

19. The decoder according to claim 18 wherein said fourth transistor is connected to first and second conduction terminals respectively of sixth and seventh N-channel transistors which belong to a second circuit line of an adjacent AND section.

20. The decoder according to claim 1 wherein an output of said decoder is provided at said first and second lines of said at least one AND circuit section.

21. The decoder according to claim 1 wherein an output of said decoder is provided at said first and second lines of said at least one OR circuit section.

22. A decoder comprising:
at least one OR circuit section having a virtual ground and comprising first and second circuit lines mutually connected and respectively receiving as inputs an address signal and an inverted address signal;
at least one AND circuit section comprising first and second circuit lines which respectively receive as inputs the inverted address signal and the address signal;
a first booster circuit comprising first and second transistors having control terminals respectively connected to said first circuit line of said at least one OR circuit section and said first circuit line of said at least one AND circuit section; and
a second booster circuit comprising first and second transistors having control terminals respectively connected to said second circuit line of said at least one OR circuit section and said second circuit line of said at least one AND circuit section.

23. The decoder according to claim 22 wherein said at least one OR circuit section comprises a plurality of OR circuit sections having a virtual ground; wherein said at least one AND circuit section comprises a plurality of AND circuit sections corresponding in number to said plurality of OR circuit sections; and wherein each OR circuit section and each AND circuit section is respectively connected to an adjacent OR circuit section and an adjacent AND circuit section, each adjacent AND circuit section being connected to ground.

24. The decoder according to claim 23 wherein said first circuit line of each OR circuit section is connected to said second circuit line of said respective adjacent OR circuit section and to said first booster circuit; and wherein said second circuit line of each OR section is connected to said first circuit line of said respective adjacent OR circuit section and to said second booster circuit.

25. The decoder according to claim 23 wherein said first circuit line of each AND circuit section is connected to said first circuit line of said respective adjacent AND circuit section and to said first booster circuit; and wherein said second circuit line of each AND circuit section is connected to said first circuit line of said respective adjacent AND section and to said second booster circuit.

26. The decoder according to claim 23 wherein a first one of said plurality of OR circuit sections is connected to a last one of said plurality of OR circuit sections.

27. The decoder according to claim 27 wherein said plurality of OR circuit sections are equal in number to a number of address signals of said decoder; and wherein said first circuit line of each OR circuit section coincides with said second circuit line of an adjacent OR circuit section.

28. The decoder according to claim 27 wherein said plurality of OR sections are mutually connected by a plurality of transistors arranged in an interdigitated configuration.

29. The decoder according to claim 22 wherein said first and second transistors of said first and second booster circuits comprise P-channel transistors.

30. The decoder according to claim 22 wherein said first transistor of said first booster circuit is connected to said first circuit line of said at least one AND circuit section at the control terminal thereof, to said first circuit line of said at least one OR section at a first conduction terminal thereof, and to a supply voltage at a second conduction terminal thereof.

31. The decoder according to claim 22 wherein said second transistor of said first booster circuit is connected to said first circuit line of said at least one OR circuit section at the control terminal thereof, to said first circuit line of said at least one AND circuit section at a first conduction terminal thereof, and to a supply voltage at a second conduction terminal thereof.

32. The decoder according to claim 22 wherein said first transistor of said second booster circuit is connected to said second circuit line of said at least one AND circuit section at the control terminal thereof, to said second circuit line of said at least one OR circuit section at a first conduction terminal thereof, and to a supply voltage at a second conduction terminal thereof.

33. The decoder according to claim 22 wherein said second transistor of said second booster circuit is connected to the second line of said at least one OR circuit section at the control terminal thereof, to said first circuit line of said at least one AND circuit section at a first conduction terminal thereof, and to a supply voltage at a second conduction terminal thereof.

34. The decoder according to claim 22 wherein said first circuit line of said at least one OR circuit section comprises a first N-channel transistor which receives as an input the address signal; and wherein said second circuit line of said at least one OR circuit section comprises a second N-channel transistor which receives as an input the inverted address signal.

35. The decoder according to claim 34 wherein said first and second circuit lines of said at least one OR circuit section are mutually connected by a plurality of N-channel transistors; and wherein a number of said plurality of N-channel transistors is equal to a number of address signals input into said decoder except for an address signal which corresponds to the address signal input to said first and second transistors of said at least one OR circuit section.

36. The decoder according to claim 35 wherein said at least one AND circuit section comprises a plurality of AND circuit sections comprising a plurality of transistors equal in number to the number of address signals input to said decoder.

37. The decoder according to claim 35 wherein said first circuit line of said at least one AND circuit section comprises a third N-channel transistor which receives as an input the inverted address signal and a fourth N-channel transistor which receives as an input one of the address signals input into the decoder; and wherein said second circuit line of said at least one AND circuit section comprises a fifth N-channel transistor which receives as an input the address signal.

38. The decoder according to claim 37 wherein said fourth transistor is connected to first and second conduction terminals respectively of sixth and seventh N-channel transistors which belong to a second circuit line of an adjacent AND section.

39. The decoder according to claim 22 wherein an output of said decoder is provided at said first and second lines of said at least one AND circuit section.

40. The decoder according to claim 22 wherein an output of said decoder is provided at said first and second lines of said at least one OR circuit section.

41. A decoder comprising:
   an OR circuit section comprising first and second circuit lines mutually connected and respectively receiving as inputs an address signal and an inverted address signal;
   an AND circuit section comprising first and second circuit lines which respectively receive as inputs the inverted address signal and the address signal; and
   a booster circuit connected to at least one of said OR circuit section and said AND circuit section.

42. The decoder according to claim 41 wherein said OR circuit section comprises a plurality of OR circuit sections; wherein said AND circuit section comprises a plurality of AND circuit sections corresponding in number to said plurality of OR circuit sections; and wherein each OR circuit section and each AND circuit section is respectively connected to an adjacent OR circuit section and an adjacent AND circuit section, each adjacent AND circuit section being connected to ground.

43. The decoder according to claim 41 wherein said first circuit line of said OR circuit section comprises a first N-channel transistor which receives as an input the address signal; and wherein said second circuit line of said OR circuit section comprises a second N-channel transistor which receives as an input the inverted address signal.

44. The decoder according to claim 41 wherein said booster circuit comprises:
   a first booster circuit comprising first and second transistors having control terminals respectively connected to said first circuit line of said OR circuit section and said first circuit line of said AND circuit section; and
   a second booster circuit comprising first and second transistors having control terminals respectively connected to said second circuit line of said OR circuit section and said second circuit line of said AND circuit section.

45. A method of using a decoder comprising at least one OR circuit section comprising first and second circuit lines and at least one AND circuit section comprising first and second circuit lines, the method comprising:
   inputting an address signal to the first circuit line of the at least one OR circuit section and the second circuit line of the at least one AND circuit section;
   inputting an inverted address signal to the second circuit line of the at least one OR circuit section and the first circuit line of the at least one AND circuit; and
   boosting a voltage of the at least one OR circuit section and the at least one AND circuit section.

46. The method according to claim 44 wherein boosting comprises:
   connecting a first booster circuit to the first circuit line of the at least one OR circuit section and the first circuit line of the at least one AND circuit section; and
   connecting a second booster circuit to the second circuit line of the at least one OR circuit section and the second circuit line of the at least one AND circuit section.

47. The method according to claim 44 further comprising providing an output of the decoder at the first and second lines of the at least one AND circuit section.

48. The method according to claim 44 further comprising providing an output of the decoder at the first and second lines of the at least one OR circuit section.

* * * * *

UNITED STATES PATENT AND TRADEMARK OFFICE
CERTIFICATE OF CORRECTION

PATENT NO. : 6,362,658 B1  Page 1 of 1
DATED : March 26, 2002
INVENTOR(S) : Luigi Pascucci It is certified that error appears in the above-identified patent and that said Letters Patent is hereby corrected as shown below:

Title page,
Item [73], Assignee, delete "STMicroelectronics S.R.L." insert -- STMicroelectronics S.r.l. --

Column 3,
Line 5, delete "is" insert -- it --
Line 14, delete "the some" insert -- some --
Lines 19 and 20, delete "Add" insert -- ADD --
Line 24, delete "will now described" insert -- will now be described --

Column 5,
Lines 59, 60, 62, 63 and 67, delete "circut" insert -- circuit --

Column 6,
Lines 2, 3, 24, 25, 31 and 32, delete "circut" insert -- circuit --

Column 8,
Line 7, delete "27" insert -- 23 --

Column 10,
Lines 26, 35 and 38, delete "44" insert -- 45 --

Signed and Sealed this

Eighth Day of October, 2002

Attest:

Attesting Officer

JAMES E. ROGAN
*Director of the United States Patent and Trademark Office*